United States Patent [19]

Alvino

[11] 4,421,877
[45] Dec. 20, 1983

[54] FLAME-RESISTANT AQUEOUS EPOXY IMPREGNATING COMPOSITIONS CONTAINING NONIONIC SURFACE ACTIVE AGENTS

[75] Inventor: William M. Alvino, Penn Hills, Pa.

[73] Assignee: Westinghouse Electric Corp., Pittsburgh, Pa.

[21] Appl. No.: 415,096

[22] Filed: Sep. 7, 1982

[51] Int. Cl.³ .................. B05D 3/02; C08L 63/02; C09J 5/02
[52] U.S. Cl. .................. 523/414; 156/330; 428/236; 428/901; 523/402; 523/456
[58] Field of Search .................. 523/456, 402, 414; 156/330; 428/901, 236

[56] References Cited

U.S. PATENT DOCUMENTS

| | | | |
|---|---|---|---|
| 3,983,056 | 9/1976 | Hosoda et al. | 523/402 |
| 4,073,762 | 2/1978 | Hosoda et al. | 523/402 |
| 4,115,328 | 9/1978 | Bozzi et al. | 523/456 |
| 4,222,918 | 9/1980 | Zentner et al. | 428/378 |
| 4,311,753 | 1/1982 | Pucci | 428/901 |
| 4,327,143 | 4/1982 | Alvino et al. | 428/236 |

*Primary Examiner*—Ronald W. Griffin
*Attorney, Agent, or Firm*—D. P. Cillo

[57] ABSTRACT

Aqueous emulsions of epoxy resins, which can be used to treat glass cloth used in the preparation of printed circuit board laminates, are produced by combining an epoxy resin and a flame retardant phenol, such as tetrabromobisphenol A, with a selected nonionic surface active agent, such as an alkylaryl polyether alcohol, monomethylol dicyandiamide curing agent and, if needed, a catalyst.

17 Claims, No Drawings

FLAME-RESISTANT AQUEOUS EPOXY IMPREGNATING COMPOSITIONS CONTAINING NONIONIC SURFACE ACTIVE AGENTS

BACKGROUND OF THE INVENTION

This invention relates to a process for producing aqueous, high solids emulsions of epoxy resins, which are not solvent based, and which are suitable as impregnating resins for use in the preparation of laminates, for example, printed circuit boards.

State and Federal air pollution control regulations have become increasingly stringent, and could significantly affect the use of solvent-based epoxy compositions for industrial use. Other than regulations, the disadvantages of solvent-based epoxy compositions include solvent evaporation costs, the possible toxicity of some of the residual solvent retained in the cured material, and the cost and availability of solvents useful for epoxy dilution. To overcome the problems associated with solvent-based epoxy compositions, many systems have been converted to completely aqueous systems. These epoxy formulations contain a multitude of components which are necessary to obtain the desired properties.

Hosoda, in U.S. Pat. No. 3,983,056, recognizes air pollution problems caused by solvents, and discloses a room temperature curable aqueous epoxy resin paint, obtained by combining a mixture of bisphenol A epoxy resin with a novolac, dimer or trimer acid epoxy type, or a methyl substituted bisphenol epoxy, 0.1% to 20% by weight, based on epoxy, of a nonionic surface active agent, preferably a polyoxyethylene benzylated phenyl ether, preferably a polyamide curing agent, and a molybdic acid salt. Hosoda, in U.S. Pat. No. 4,073,762, teaches the use of a polyamide curing agent derived from a dimer acid and a polyether diamine to be used with the paint composition disclosed above. The combination of these compounds is essential to obtain this emulsified paint. The paint is used, for example, as a rust preventive primer.

Zentner, in U.S. Pat. No. 4,222,918, teaches the use of dicyandiamide dissolved in water as a curing agent for an emulsion of epoxy, anionic polycarboxylic emulsifying agent, and thermoplastic resin, such as polyvinyl formal or polysulfone. However, dicyandiamide has limited solubility in aqueous systems and is not very effective in the preparation of higher weight solids water emulsions. The use of a dicyandiamide derivative, such as monomethylol dicyandiamide, helps eliminate the solubility problem and enables one to prepare a wider range of emulsions. The preparation of these compounds, in organic solvents, is disclosed by Alvino et al., in U.S. Pat. No. 4,327,143. This solvent based system is not able, however, to utilize energy efficient infrared "B" staging operations without potential flammability problems. Substitution of water for solvent in the Alvino et al. compositions, to decrease potential flammability problems, may result in unstable mixtures with phase separation of water.

The need for energy efficient and non-polluting epoxy based high solids resin systems, that are also non-flammable, stable in and compatible with water, and possess suitable electrical and mechanical properties required by certain laminates, such as printed circuit boards, has not been met by these prior art compositions.

SUMMARY OF THE INVENTION

The above need has been met and the above problems solved by providing a high solids, emulsified, aqueous impregnating composition comprising: (1) epoxy resin, (2) flame retardant phenol, (3) a selected nonionic surface active agent, (4) a latent curing agent, preferably monomethylol dicyandiamide, (5) water, and if needed, (6) a catalyst, such as benzyldimethylamine. The useful weight ratio of epoxy:flame retardant phenol:nonionic surface active agent solids:latent curing agent is about (100):(1 to 100):(13 to 25):(2 to 10). Water is usually combined with the nonionic surface active agent, curing agent, and catalyst to provide aqueous solutions.

There are two methods by which the emulsion can be created. In the fusion method, the epoxy resin is combined with the flame retardant phenol, preferably tetrabromobisphenol A at about 25° C. Then these two ingredients are heated to from about 80° C. to 100° C. over a 20 to 30 minute period, to form a reaction product consisting essentially of a homogeneous brominated epoxy solution, when tetrabromobisphenol A is used. This reaction product is then cooled and combined with the selected nonionic surface active agent. Monomethylol dicyandiamide or dicyandiamide dissolved in water is then added incrementally under constant stirring at from about 40° C. to 55° C.

The preferred method is in-situ addition, which mixes the selected nonionic surface active agent and the epoxy resin, then heats the mixture up to from about 80° C. to 90° C. When the mixture is at about 85° C., the flame retardant phenol is then added until it dissolves in about ½ to 5 minutes, after which the admixture is immediately cooled so that no reaction product is formed. Then monomethylol dicyandiamide or dicyandiamide dissolved in water is added in increments at from about 40° C. to 55° C. A catalyst, such as benzyldimethylamine may also be introduced. Glass cloth or other porous substrate material may be impregnated with the emulsion and "B" staged in a convection oven. A plurality of these impregnated substrates can then be heat and pressure consolidated to form a laminate.

This composition provides superior mechanical and electrical properties, and imparts increased flame resistance to cured, impregnated substrates such as glass cloth used for printed circuit board laminates. This composition, utilizing a nonionic surface active agent, reduces surface tension between water and hydrophobic components of the admixture, allowing a stable epoxy-water emulsion having a solids content of from about 50% to about 70%. The manufacture of the composition also can use less energy because energy efficient infrared radiation can be used to "B" stage impregnated substrates, and the use of such infrared radiation can allow much faster line speeds.

DESCRIPTION OF THE PREFERRED EMBODIMENTS

Epoxy resins that are suitable for the water-based emulsion of this invention include diglycidyl ethers of bisphenol A, diglycidyl ethers of bisphenol F, polyglycidyl ethers of a novolac, glycidyl esters, hydantoin epoxy resins, cycloaliphatic epoxy resins, and diglycidyl ethers of aliphatic diols, all of which are commercially available and described in detail by Smith, et al., in U.S. Pat. No. 4,273,914. The preferred epoxy resin is a liquid diglycidyl ether of bisphenol A having an epoxy equivalent weight of from about 180 to 215. This preferred epoxy resin provides a more controlled reaction, and provides superior mechanical and electrical properties in laminates.

Any halogenated phenol may be used in the resin mixture to impart flame resistance to the cured product, such as chlorinated phenols, however, tetrabromobisphenol A (TBBPA) is particularly effective. These materials chemically react with the other components to provide an internal flame resistance. Other flame retardant materials such as $Sb_2O_3$ and $Al_2O_3.3H_2O$ do not chemically react with the other components, and are not as effective as flame retardant agents.

The useful class of nonionic surface active agents is a nonionic alkylaryl polyether alcohol having the following general structural Formula:

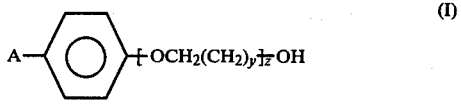

(I)

where A is an alkyl group having from 5 to 10 carbons, preferably from 8 to 9 carbons, $y = 1$ to 2, and $z = 15$ to 70, preferably 25 to 70. Below $z = 15$, difficulty in forming a stable emulsion will be encountered. The preferred nonionic surface active agents are those prepared by the reaction of octyl phenol or nonyl phenol with ethylene oxide or propylene oxide. They are usually in the form of a 60% to 80% aqueous solution. The nonionic surface active agent should comprise from about 13 to 25 parts solids based on 100 parts by weight of epoxy resin. If below 13 parts are used, there is an increase in viscosity, separation, and foaming. Anionic or cationic surface active agents are not useful in this invention.

Monomethylol dicyandiamide, the preferred curing agent, provides moisture resistance and prevents crystallization and void formation in the cured product. This curing agent has increased solubility in aqueous solutions and thus allows higher solids weight products to be formed than if dicyandiamide is used. Dicyandiamide can be used, however. These are both latent curing agents which initiate cure at above about 155° C., i.e., they are not capable of curing at room temperature but will cure at reaching a certain elevated temperature, such as 160° C. Room temperature curing agents are not useful because "B" staged laminates could not be produced. The useful weight ratio of (epoxy resin):(flame retardant phenol):(nonionic surface active agent solids):(monomethylol dicyandiamide or dicyandiamide latent curing agent) is from about (100):(1 to 100):(13 to 25):(2 to 10). The monomethylol dicyandiamide or dicyandiamide is usually added as an aqueous solution.

The catalyst concentrations may be varied over a broad range to provide effective cure conditions dictated by the process. The benzyldimethylamine (BDMA) solids may be varied from about 0.2% to about 0.6% of the weight of the epoxy resin. The preferred range is from about 0.4% to about 0.6% based on the weight of the epoxy resin. Potassium carbonate dissolved in water may be added in an amount of from about 0.03% to about 0.12% based on the weight of the epoxy resin. The potassium carbonate is used for catalyzing the emulsified impregnation composition. Acid salts are not useful in this invention, adding ionic impurities which have a deleterious effect on the electrical properties of the final laminate.

The fusion product, which is made by heating the epoxy resin plus the flame retardant phenol, at from about 80° C. to 100° C. over a 20 to 30 minute period to form a reaction product, is made water compatible by mixing in the nonionic surface active agent at 50° C. ± 5° C., using a variable speed air stirrer with a suitable impeller to insure thorough mixing. A monomethylol dicyandiamide-water or dicyandiamide-water solution is then added at about 50° C. to the emulsion in about 10 percent aliquots, and stirring is continued until the system is homogeneous. When the blend is homogeneous, a second 10 percent volume of monomethylol dicyandiamide-water or dicyandiamide-water solution is added and again stirred until homogeneous. In the in-situ process, the nonionic surface active agent is added to the epoxy and the mixture temperature is raised to about 85° C., followed by flame retardant phenol addition at about 85° C. for up to about 5 minutes without cooling, so that a reaction product is not formed. This admixture is then cooled to about 50° C. and the latent curing agent-water solution is then added in increments.

During the initial additions of water with the curing agent, a water-in-resin emulsion is formed and the system becomes increasingly thixotropic. After about one-half of the monomethylol dicyandiamide-water or dicyandiamide-water solution is added, an inversion to a resin-in-water emulsion occurs with an abrupt drop in viscosity. When this point is reached, the remainder of the monomethyl dicyandiamide-water or dicyandiamide-water solution is added continuously under moderate stirring. The usual addition is in ten, 10% increments. If the latent curing agent-water solution is added all at once, an emulsion will not form. If added in increments larger than 25% increments, the emulsion will tend to be unstable.

Properly prepared, the emulsion will have a white color, a low viscosity, and a droplet size of from about 3 to 9 microns. Some settling may occur after about twenty-four hours, but the settled material is easily reintroduced into the emulsion by hand stirring. To catalyze the emulsified impregnating composition, $K_2CO_3$ (potassium carbonate) dissolved in water, and benzyldimethylamine (BDMA) are added and thoroughly mixed. The solids content of the admixture is usually from about 60% to 70% in water.

Glass cloth is treated and "B" staged, i.e., dried but not completely cured, at around 155° C. in a convection oven, or the glass cloth may be passed under an infrared radiation source to "B" stage it. The resin content of the glass cloth ranges from about 35% to about 50% by weight. A laminate can be prepared from a plurality of treated glass cloth sheets with good impregnation of the glass cloth by the emulsion. This laminate can be finally cured and used as a heat and flame resistant printed circuit board, which can be clad with a copper conductor sheet applied to at least one surface, or have conductive copper circuits applied thereto.

EXAMPLE 1

An emulsified impregnating composition formulation was prepared using the fusion process. To a 2,000 ml round bottom flask equipped with a stirrer, thermometer, condenser and $N_2$ inlet tube, was added 912 g. (2.28 parts) of an epoxy resin having an epoxy equivalent weight of from 193 to 203 and a viscosity at 25° C. of from 3,000 cps to 7,000 cps. (sold commercially by Shell Chemical Co. under the tradename Epon 829) and 400 g. (1.00 part) of tetrabromobisphenol A (TBBPA). The mixture was heated and stirred under a N₂ blanket until the temperature reached 90° C., over a 20 minute period, and all the material dissolved to form a homogeneous solution reaction mixture. At this point the reaction mixture obtained was analyzed and found to contain 3.75% oxirane oxygen according to the analytical procedure described in the *Handbook of Epoxy Resins* by Lee and Neville, Chapter 4–17. This percentage corresponds to an epoxide equivalent (EEW) of 427.

To 100 g. of the above reaction product, which was heated to 50° C., was added 10 g. of a nonionic surface active agent, an octylphenol polyether alcohol, where A=8 carbons, y=1 and z=30 in Formula (I) hereinbefore described (sold commercially by Rohm and Haas Co. under the tradename Triton X-305). The ingredients were mixed thoroughly at about 1,000 rpm. The mixture was opaque white in color and homogeneous. To this mixture at 50° C. was added 5 g. of dicyandiamide dissolved in 140 ml of tap water, in 14 ml increments, approximately 10% of the total volume. During the addition, the mixture was constantly being stirred.

A very viscous mixture was obtained after the first 2 to 3 portions of the dicyandiamide-water were added. Upon further addition of the dicyandiamide-water solution, the emulsion inverted to give a watery emulsion. After inversion, the remainder of the dicyandiamide-water solution was used. A white homogeneous emulsion then was obtained. No separation occurred after about 2 days at room temperature. This emulsion provided a useful low viscosity, aqueous, epoxy impregnating composition.

EXAMPLE 2

An emulsified impregnating composition formulation was prepared from the following ingredients, using the in-situ process:

| | |
|---|---|
| Epon 829 epoxy resin | 100.00 g. |
| Tetrabromobisphenol A (TBBPA) | 51.43 g. |
| Triton X-305 nonionic surface active agent (70% aqueous solution) | 21.60 g. (15.1 g. solids) |
| Tap H₂O | 100.00 g. |
| Monomethylol Dicyandiamide* | 3.77 g. |

*N—Cyano-N'—Hydroxymethyl Guanidine

The nonionic surface active agent, an octylphenol polyether alcohol, where A=8 carbons, y=1 and z=30 in Formula (I) hereinbefore described, (sold commercially by Rohm and Haas Co. under the trade name Triton X-305) was thoroughly mixed at room temperature with an epoxy resin having an epoxy equivalent weight of from 193 to 203 and a viscosity at 25° C. of from 3,000 cps. to 7,000 cps. (sold commercially by Shell Chemical Co. under the trade name Epon 829). The mixture was heated to from 80° C. to 90° C. and TBBPA was added and stirred until it all dissolved over a 1 to 5 minute period. The mixture was not cooked to provide a reaction product. The clear amber resin was immediately cooled to from 40° C. to 50° C., and then a monomethylol dicyandiamide-water solution was added in 10 percent increments, with stirring at about 1,000 rpm.

Initially a white viscous mixture was obtained after the first incremental monomethylol dicyandiamide-water solution addition. The consistency of the emulsion after successive additions of monomethylol dicyandiamide-water, changed from viscous to creamy to watery. After the emulsion reverts from a viscous to a watery mixture, the remainder of the monomethylol dicyandiamide-water solution was added at a reduced stirring speed. A white, homogeneous, approximately 60% solids fluid emulsion was obtained. No separation occurred after two days at room temperature.

The Brookfield viscosity at 23° C. measured from 70 cps. to 80 cps. To this emulsified impregnating composition was added 0.093 g. K₂CO₃ dissolved in 0.18 g. H₂O, and 0.45 g. benzyldimethylamine (BDMA). The ingredients were thoroughly mixed. No separation of the emulsion occurred after 10 hrs. This provided a useful low viscosity, catalyzed, aqueous, high solids, epoxy impregnating composition, where the nonionic surface active agent was effective to lower surface tension between the hydrophobic epoxy component and the water, and allow a stable emulsion.

EXAMPLE 3

The same emulsified impregnating composition was made as described in Example 2, except that the amount of monomethylol dicyandiamide was increased from 3.77 g. to 6 g. To the resulting emulsion was added 0.093 g. K₂CO₃ in 0.186 g. H₂O, and 0.45 g. BDMA. No separation of the emulsion occurred after 20 hrs. The gel time of this emulsion measured 30 minutes at 153° C. The viscosity of the emulsion ranged from 60 cps. to 66 cps. at 25° C. Additionally, 0.65 g. of BDMA was added to the emulsion without separation. The gel time was remeasured and found to be 20 minutes. These emulsions provided useful epoxy impregnating compositions.

EXAMPLE 4

The following ingredients were mixed as described in Example 2, to provide Samples A through F, to determine the effect of concentration of Triton X-305 nonionic surface active agent on emulsion preparation:

| | Amount, Grams | | | | | |
|---|---|---|---|---|---|---|
| | A* | B* | C | D | E | F |
| Epon 829 | 100 | 100 | 100 | 100 | 100 | 100 |
| TBBPA | 51.43 | 51.43 | 51.43 | 51.43 | 51.43 | 51.43 |
| Tap H₂O | 100 | 100 | 100 | 100 | 100 | 100 |
| Monomethylol-Dicyandiamide | 6 | 3.77 | 6 | 3.77 | 6 | 3.77 |
| Triton X-305** | 14 | 17.3 | 21.6 | 28.1 | 30 | 32.4 |
| (Triton solids) | (9.8) | (12.1) | (15.1) | (19.7) | (21.0) | (22.7) |

*Comparative sample
**70% aqueous solution

Emulsions were prepared from all of the above Samples as described in Example 2, and the following observations were made regarding emulsion quality, stability, and viscosity as set forth in TABLE 1 below:

TABLE 1

| Emulsion | Quality** | Stability |
|---|---|---|
| A* | Poor | None. Separated into layers |
| E | Excellent | >1 day. Homogeneous |
| C | Excellent | >1 day. Homogeneous |
| D | Excellent | >1 day. Homogeneous |
| B* | Poor | <5 hrs. Separated into two layers |
| F | Excellent | >1 day. Homogeneous |

*Comparative sample
**Based on color, stability and viscosity.

As can be seen, the addition of Triton X-305 solids at 9.8 and 12.1 parts by weight per 100 parts epoxy yielded poor results. The viscosity of the emulsions was measured using a Brookfield viscometer at 25° C.:

| Emulsion | Viscosity Range, cps. |
|---|---|
| A* | — |
| B* | — |
| C | 60 to 100 |
| D | 60 to 120 |
| E | 60 to 130 |
| F | 200 to 500 |

These emulsions provided very fluid impregnating compositions.

EXAMPLE 5

Emulsion Samples C, D, E, and F, prepared in Example 3, were catalyzed by adding BDMA and $K_2CO_3$ in the following amounts: BDMA solids 0.45%, $K_2CO_3$ 0.093%, and $H_2O$ 0.186%. These percentages are based on the total weight of the epoxy resin. $K_2CO_3$ was dissolved in $H_2O$ before adding it to the emulsion. After adding these catalysts, the stability of the emulsion was recorded. No separation of the emulsion was observed after 20 hours. The gel times at 153° C. of these emulsions were measured and ranged between 27 to 30 minutes, showing good setup properties.

EXAMPLE 6

In this experiment several different nonionic surface active agents were used to determine their effectiveness in emulsion formation. The resin composition was as follows:

| | |
|---|---|
| Epon 829 | 100 g. |
| TBBPA | 51.43 g. |
| Tap $H_2O$ | 100 g. |
| Monomethylyol-Dicyandiamide | 6 g. |

The nonionic surface active agents (described by tradenames and in relation to Formula (I) hereinbefore described), were added as follows:

| | Y in Formula (I) | Z in Formula (I) | Series | Grams (Solids) |
|---|---|---|---|---|
| Triton X-305 | 1 | 30 | Octyl (A = 8 carbons) | 15.1 |
| Triton X-405 | 1 | 40 | Octyl (A = 8 carbons) | 15.1 |
| Triton X-705 | 1 | 70 | Octyl (A = 8 carbons) | 15.1 |
| Triton N-401 | 1 | 40 | Nonyl (A = 9 carbons) | 15.1 |
| Tergitol NP-40 | 1 | 40 | Nonyl (A = 9 carbons) | 15.1 |
| Tergitol NP-4* | 1 | 4 | Nonyl (A = 9 carbons) | 15.1 |

*Comparative sample

The procedure used to prepare the emulsions was the same as described in Example 2. The emulsion characteristics with the various emulsifiers are described in TABLE 2 below:

TABLE 2

| Emulsifier | Emulsion Properties |
|---|---|
| Triton X-305 | Stability >24 hrs. Viscosity, 23° C. = 40 to 120 cps. |
| Triton X-405 | Slight separation of layers. Restirred manually to form homogeneous emulsion. Viscosity, 23° C. = 300 cps. |
| Triton X-705 | Homogeneous emulsion. No separation after 24 hrs. Viscosity, 23° C. = 1,100 cps. Initial foam formation which dissipated after a short time |
| Triton N-401 | Stability >24 hrs. Viscosity, 23° C. = 800 cps. Initial foam formation which dissipated after a short time. |
| Tergitol NP-40 | Stability >24 hrs. Viscosity, 23° C. = 800 cps. |
| Tergitol NP-4* | No emulsion formed. |

*Comparative sample

Additional comparative emulsifier samples, sorbitan laurate, a lipophilic nonionic surface active agent (sold commercially by ICI United States Inc., Atlas Division, under the trade name Span 20); polyoxylthylene sorbitan laurate, a hydrophilic nonionic surface active agent (sold commercially by ICI United States Inc., Atlas Division, under the trade name Tween 20), and mixtures thereof were tried using comparable amounts as described above, and the products could not be emulsified. These additional comparative emulsifiers have a formula completely different from that shown in Formula (I).

EXAMPLE 7

Using the resin prepared as described and catalyzed in Example 2, glass cloth (Style 7628 A-100) was impregnated therewith, and then "B" staged for 7 minutes at 155° C. in a convection oven, to form a prepreg. The resin content of the glass cloth ranged from 35% to 50%. A laminate was prepared by pressing an 8 ply stack-up of the treated glass cloth prepregs (6"×6") at 420 psi, and at from 160° C. to 180° C., for 55 minutes. The laminate produced was a unitary bonded laminate, that was homogeneous in color with good impregnation of the glass cloth by the resin. Both single and double side copper clad laminates were prepared using this same procedure by adding 1 oz./sq.ft. copper foil exterior sheets to the stack-up.

EXAMPLE 8

Laminates of emulsion impregnated glass cloth were made from nine 12"×18" plies of prepreg and one exterior sheet of 1 oz./sq.ft. copper foil about 1 mil thick. The glass cloth and laminating procedures were similar to that used in Example 6. The emulsified impregnating composition was similar to that used in Example 2, except that 5 g. of monomethylol dicyandiamide was used, and 82 g. of tap water was used, to give a 65% solids composition. Samples were tested using the standard test procedures for flame-resistant FR-4 laminates. The results are reported in TABLE 3 below:

TABLE 3

| Dielectric Breakdown, kV* | Dielectric Constant** | Dissipation Factor*** |
|---|---|---|
| 50 | 5.23 | 0.0211 |

*NEMA Standard = >45.
**NEMA Standard = <5.4
***NEMA Standard = <0.035.

As can be seen, the copper clad circuit board type laminates are well within NEMA standards. Additionally, a piece of laminate was immersed into molten solder (260° C.) for 30 seconds with no blistering or flaming.

I claim:

1. An aqueous impregnating emulsion, said emulsion consisting essentially of the admixture of:
   (a) an epoxy resin;
   (b) a flame retardant phenol;
   (c) a nonionic alkylaryl polyether alcohol surface active agent having the general structural formula:

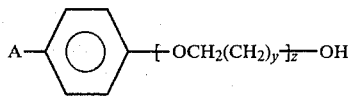

where A is an alkyl group having from 5 to 10 carbons, y=1 to 2, and z=15 to 70;
   (d) a latent curing agent selected from the group consisting of monomethylol dicyandiamide and dicyandiamide; and
   (e) water; where the weight ratio of (epoxy resin):(flame retardant phenol):(nonionic surface active agent solids):(latent curing agent solids) is about (100):(1 to 100):(13 to 25):(2 to 10).

2. An aqueous impregnating emulsion, said emulsion consisting essentially of the admixture of:
   (a) the reaction product of an epoxy resin and a flame retardant phenol;
   (b) a nonionic alkylaryl polyether alcohol surface active agent having the general structural formula:

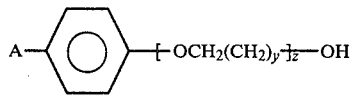

where A is an alkyl group having from 5 to 10 carbons, y=1 to 2, and z=15 to 70;
   (c) a latent curing agent selected from the group consisting of monomethylol dicyandiamide and dicyandiamide; and
   (d) water; where the weight ratio of (epoxy resin):(flame retardant phenol):(nonionic surface active agent solids):(latent curing agent solids) is about (100):(1 to 100):(13 to 25):(2 to 10).

3. The emulsion of claim 1 or claim 2, wherein the epoxy resin is selected from the group consisting of diglycidyl ethers of bisphenol A, diglycidyl ethers of bisphenol F, polyglycidyl ethers of a novolac, glycidyl esters, hydantoin epoxy resins, cycloaliphatic epoxy resins, and diglycidyl ethers of aliphatic diols.

4. The emulsion of claim 1 or claim 2, wherein the flame-retardant phenol is a halogenated phenol.

5. The emulsion of claim 1 or claim 2, wherein the flame-retardant phenol is tetrabromobisphenol A.

6. The emulsion of claim 1 or claim 2, wherein the epoxy is a diglycidyl ether of bisphenol A.

7. The emulsion of claim 1 or claim 2, wherein the curing agent is monomethylol dicyandiamide, and water is present in an amount effective to provide a solids content for the composition of from about 50% to about 70%.

8. The emulsion of claim 1 or claim 2, including a catalyst comprising benzyldimethylamine.

9. The emulsion of claim 1 or claim 2, wherein the epoxy resin is a diglycidyl ether of bisphenol A having an epoxy equivalent weight from about 180 to 215, the flame retardant phenol is tetrabromobisphenol A, the nonionic surface active agent has the following general structural formula:

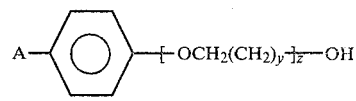

where A is an alkyl group having 8 to 9 carbons, y=1 to 2 and z=25 to 70, and the curing agent is monomethylol dicyandiamide.

10. The emulsion of claim 1 or claim 2, wherein the composition is impregnated into a porous substrate.

11. The emulsion of claim 1 or claim 2, wherein the composition is impregnated into a glass cloth substrate.

12. The emulsion of claim 1 or claim 2, wherein the composition is impregnated into a plurality of glass cloth substrates, said substrates being heat and pressure consolidated to form a laminate.

13. The emulsion of claim 1 or claim 2, wherein the composition is impregnated into a plurality of porous substrates, said substrates being heat and pressure consolidated with at least one exterior copper conductive sheet to form a laminated copper clad laminate.

14. A method of making an aqueous impregnating emulsion comprising the steps of:
   (a) mixing an epoxy resin and a flame retardant phenol, and heating them up to from about 80° C. to about 100° C. over from about 20 minutes to about 30 minutes, to provide a reaction product, and
   (b) cooling the reaction product, and then adding thereto a nonionic alkylaryl polyether alcohol surface active agent having the general structural formula:

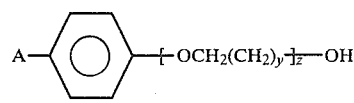

where A is an alkyl group having from 5 to 10 carbons, y=1 to 2, and z=15 to 70, and a latent curing agent water solution, wherein the latent curing agent is selected from the group consisting of monomethylol dicyandiamide and dicyandiamide, the latent curing agent water solution being added incrementally, to provide an emulsion; where the weight ratio of (epoxy resin):(flame retardant phenol):(nonionic surface active agent solids):(latent curing agent solids) is about (100):(1 to 100):(13 to 25):(2 to 10).

15. The method of claim 14, wherein the epoxy resin is a diglycidyl ether of bisphenol A having an epoxy equivalent weight from about 180 to 215, the flame retardant phenol is tetrabromobisphenol A, the nonionic surface active agent has the following general structural formula:

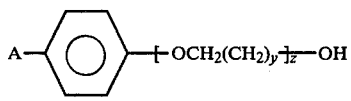

where A is an alkyl group having from 8 to 9 carbons, y=1 to 2 and z=25 to 70, and the curing agent is monomethylol dicyandiamide.

16. A method of making an aqueous impregnating emulsion comprising the steps of:

(a) mixing an epoxy resin and a nonionic alkylaryl polyether alcohol surface active agent having the general structural formula:

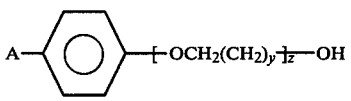

where A is an alkyl group having from 5 to 10 carbons, y=1 to 2, and z=15 to 70, and heating them up to from about 80° C. to about 90° C., to provide a mixture, (b) adding a flame retardant phenol to the admixture at from about 80° C. to about 90° C., and mixing for up to about 5 minutes, to provide an admixture, and (c) cooling the admixture of (b), and then adding incrementally, thereto a latent curing agent water solution, to provide an emulsion, wherein the latent curing agent is selected from the group consisting of monomethylol dicyandiamide and dicyandiamide; where the weight ratio of (epoxy resin):(flame retardant phenol):(nonionic surface active agent solids):(latent curing agent solids) is about (100):(1 to 100):(13 to 25):(2 to 10).

17. The method of claim 16, wherein the epoxy resin is a diglycidyl ether of bisphenol A having an epoxy equivalent weight from about 180 to 215, the flame retardant phenol is tetrabromobisphenol A, the nonionic surface active agent has the following general structural formula:

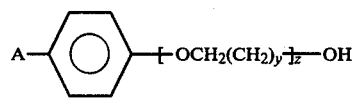

where A is an alkyl group having from 8 to 9 carbons, y=1 to 2 and z=25 to 70, and the curing agent is monomethylol dicyandiamide.

* * * * *